United States Patent [19]

Ferrant

[11] Patent Number: 4,707,810
[45] Date of Patent: Nov. 17, 1987

[54] INTEGRATED CIRCUIT MEMORY

[75] Inventor: Richard Ferrant, Aix en Provence, France

[73] Assignee: Eurotechnique, Rousset, France

[21] Appl. No.: 818,031

[22] Filed: Jan. 13, 1986

[30] Foreign Application Priority Data

Jan. 15, 1985 [FR] France .................. 85 00525

[51] Int. Cl.⁴ .............................................. G11C 7/00
[52] U.S. Cl. .................................................. 365/200
[58] Field of Search ................. 365/200, 210; 371/10, 371/21

[56] References Cited

U.S. PATENT DOCUMENTS 4,358,833 11/1982 Folmsbee et al. ................ 365/200
4,532,611 7/1985 Countryman, Jr. ............... 365/200

FOREIGN PATENT DOCUMENTS 0044628 1/1982 European Pat. Off. .
0083212 7/1983 European Pat. Off. .
0090332 10/1983 European Pat. Off. .

Primary Examiner—Joseph A. Popek
Attorney, Agent, or Firm—Oblon, Fisher, Spivak, McClelland, & Maier

[57] ABSTRACT

An integrated circuit memory is provided in which a repair circuit allows a redundant cell line to be substituted for a cell line which has proved defective. In the invention, access is had to the repair circuit by using the properties of the decoder of the memory. An instruction for decomposing a fuse is given, for all the repair circuits of the memory, through a single external terminal conected to a connection which serves all the repair circuits. When the fuse is decomposed, a bistable circuit changes state and switches the cell lines.

6 Claims, 4 Drawing Figures

INTEGRATED CIRCUIT MEMORY

BACKGROUND OF THE INVENTION

1. Field of the Invention

The invention relates to integrated circuit memories and more particularly to memories having repair circuits.

An integrated circuit memory is in the form of a semiconductor wafer having microscopic electronic circuits arranged with respect to each other which may contain, by their electric states, digitized information. The evolution of the technique for manufacturing memories tends to an increase in the density of the circuits contained in the memories, as well as an increase in the size of the memories themselves. The reasons for this evolution are essentially related to the greater reliability of integrated circuits with respect to comparable organizations made with discrete elements. This desired technical evolution meets with a major difficulty: the possibility of effectively manufacturing the memory circuits contemplated. The increase in density of the circuits leads manufacturers to produce memories whose elementary pitch is of the order of a micrometer. Consequently, the photolithographic masks used for manufacturing the memories must be accurately made: they are expensive.

Furthermore, the technical evolution of circuits is such that the commerical interests of such circuits is limited in time. They are rapidly obsolete. For this reason manufacturers do not have sufficient time for improving the productivity of their machines. The yields of these manufacturing machines are always less than one. The manufacture, or rather sampling, of the memories is therefore followed by a phase for checking the quality of the manufactured memories: the defective pieces are rejected. The rejects are all the more numerous the larger the size of the memories to be manufactured, or the smaller their manufacturing pitch or else the more recent the design of the circuit. To overcome these disadvantages, manufacturers have thought of providing these memories with repair circuits. The purpose of the repair circuits is to substitute, in a memory, a circuit in good condition for a defective circuit. The purpose of the present invention is to increase the operating efficiency of the repair circuits as well as simplifying the bringing into operation of these repair circuits. The result will be an improvement in the manufacturing yield.

In memories, the information is contained in memory cells.

They are distributed in a matrix in a line and column arrangement. The memories also comprise decoders: at least one line decoder for selecting a cell line and possibly a column decoder for selecting a cell column. In the memories, the cells of the same cell line are connected to a common connection or possibly to the two same complementary connections called bit lines. These bit lines allow the electric states contained, or to be contained, in the memory cells to be transmitted.

These bit lines are each biased at one end by a supply circuit and each is connected at the other end to a bit line selection circuit. The bit line selection circuits of a cell line are themselves controlled by outputs of the line decoder which corresponds to the cell line in question. The repair circuits concerned by the present invention are circuits interconnected between selection circuits and the corresponding outputs of the decoder.

The purpose of the repair circuits is to disable the selection circuits of a cell line and thus to place the bit lines of this cell line out of operation. When such disabling has taken place, the repair circuit establishes a connection between the coder and a repair connection. An additional cell line is connected to this repair connection. This additional line is redundant with respect to the nominal capacity of the memory. The repair circuits must then be able to assume two separate states. In a first state, they do not interfere with the normal operation of the decoder and of the cell lines. In repair operation they transport the selection orders assigned to a cell line in poor condition to a redundant cell line. In order to be able to assume these two states, the repair circuits of the prior art comprise a bistable circuit connected in cascade with a fuse. Under normal operation, the fuse is not cut, the distable is in a first state. When it is desired to go over to a repair situation, the fuse is cut. Such cutting of the fuse is obtained by external means. The bistable then changes state.

2. Description of the Prior Art

In the state of the art means are known for melting the fuses. These means comprise essentially means for holding the semiconductor wafer opposite a laser. The ray of the laser is moved with respect to the wafer so that this ray is directed very precisely on a fuse to be melted. A laser ray pulse is set: the fuse melts. The repair circuit then changes state, and a connection is formed between the output or outputs of the decoder which correspond to the cell line in question and a repair connection connected to an additional cell line. At the same time the information concerning the change of state of the repair circuit is used for disabling the selection circuits of the cell lines thus placed out of operation.

This construction has two drawbacks. The main drawback resides in the manipulation of the laser. On the one hand acquisition of the laser is expensive which increases the price of the manufactured memories and, on the other hand, manipulation of this laser is delicate. In fact, it is necessary to place the laser with respect to the wafer such that it aims exactly at the position of the fuse to be melted. The time lost in learning handling of the laser, handling relative to each type of memory manufactured, must be deducted from the commercial lifespan of the memory in question. Furthermore, it is not always sufficient to replace a deficient cell line by a redundant cell line. In fact, if the deficient cell line is the location of an electric short circuit, for example between one of its bit lines and a supply circuit, the memory, which is functionally sound since it has been repaired, is even so rejected during verification tests for excessive electric consumption. This excessive electric consumption means that the circuit departs from the ranges of specifications guaranteed by the manufacturer. Under such conditions, all the advantages which it had been hoped to be found cannot be expected of the repair circuits.

SUMMARY OF THE INVENTION

The present invention overcomes the above mentioned disadvantages by providing repair circuits in which access to the fuse for cutting it is obtained by using quite simply one of the decoders of the memory. The address of one line of a cell line in question is programmed therein, which allows it to be selected, and at the same time a pulse is fed to a single additional control terminal for cutting the fuse corresponding to the selected cell line or column. Furthermore, the information relating to the change of state of the information repair circuit is used for further cutting the power supply of the cell line in question.

The invention provides then an integrated circuit memory comprising:
  memory cells distributed in lines and columns in a matrix,
  at least one line decoder for selecting cell lines by its outputs,
  repair circuits interconnected between the cell lines and at least one output of the decoder, each having a fuse and each being capable of switching, as a function of the state of the fuse, from connections between the decoder and the lines to connections between the decoder and at least one repair connection,
  at least one additional cell line connected to the repair connection, and further comprising
  means for melting the fuses, these means comprising for each fuse,
  a switch in series with the fuse,
  a logic control gate having two inputs for actuating the switch:
  a first input of the logic gate being connected to an output of the decoder, and
  a second input of the logic gate being connected in common to several logic gates of repair circuits of the memory and to a single external access terminal for controlling the cutting of the fuses.

BRIEF DESCRIPTION OF THE DRAWINGS

The invention will be better understood from reading the following description with reference to the accompanying Figures. This description and these Figures are only given by way of indication and they are in no wise limitative of the invention. In particular, it is quite possible to transpose the description of the invention relating to static memories to memories of a different type (DRAM, EPROM . . . ) whether these memories are of random access or not. In addition, the description likening the lines to bit lines and the columns to word lines cannot be a bar to obvious transposition of the means used. These may be associated with one or other of these matrix division directions of the memory. These Figures show.

DESCRIPTION OF THE PREFERRED EMBODIMENTS

Figure 1A:
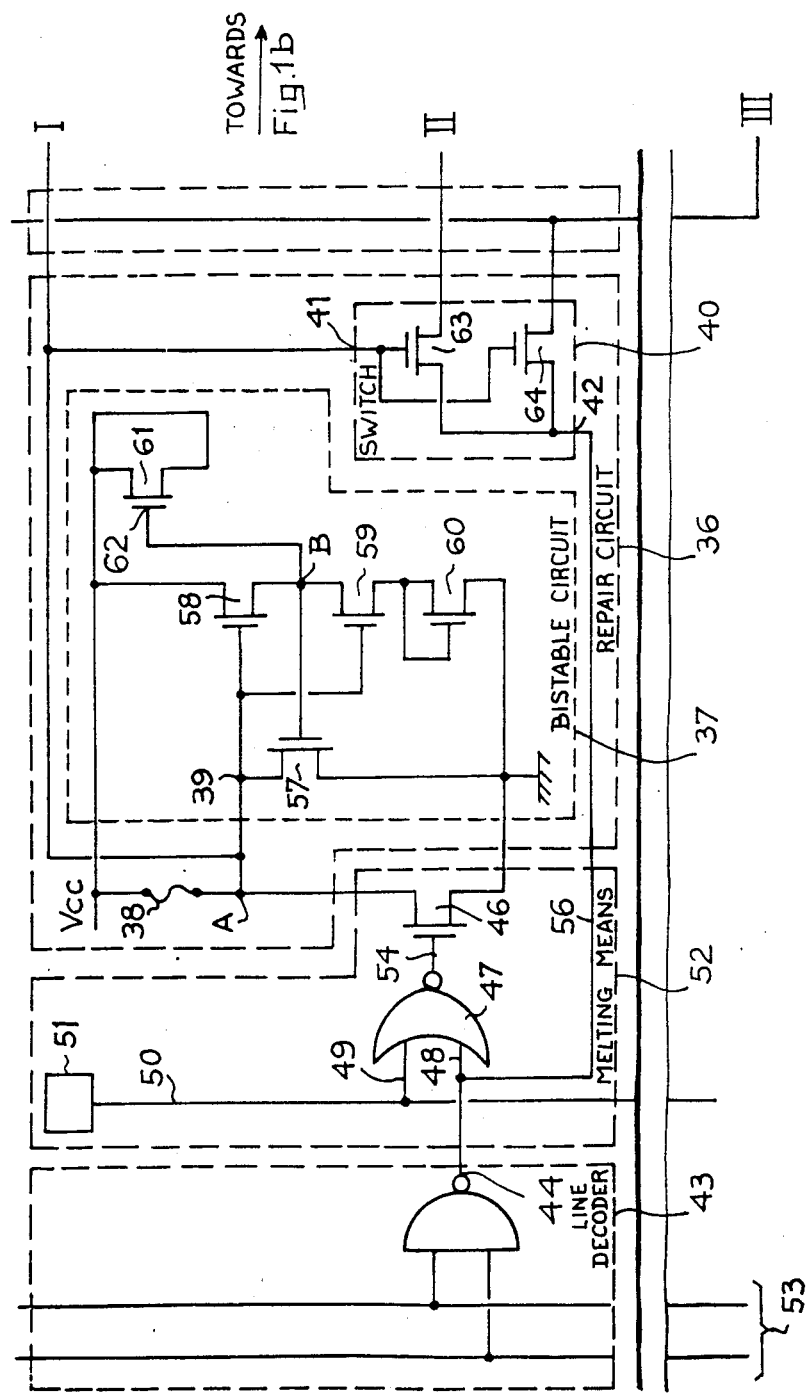
FIGS. 1a and 1b, a schematical representation of a memory comprising the features of the invention. These Figures are shown on two separate sheets which correspond exactly by three connections I, II, III.
Figure 1B:
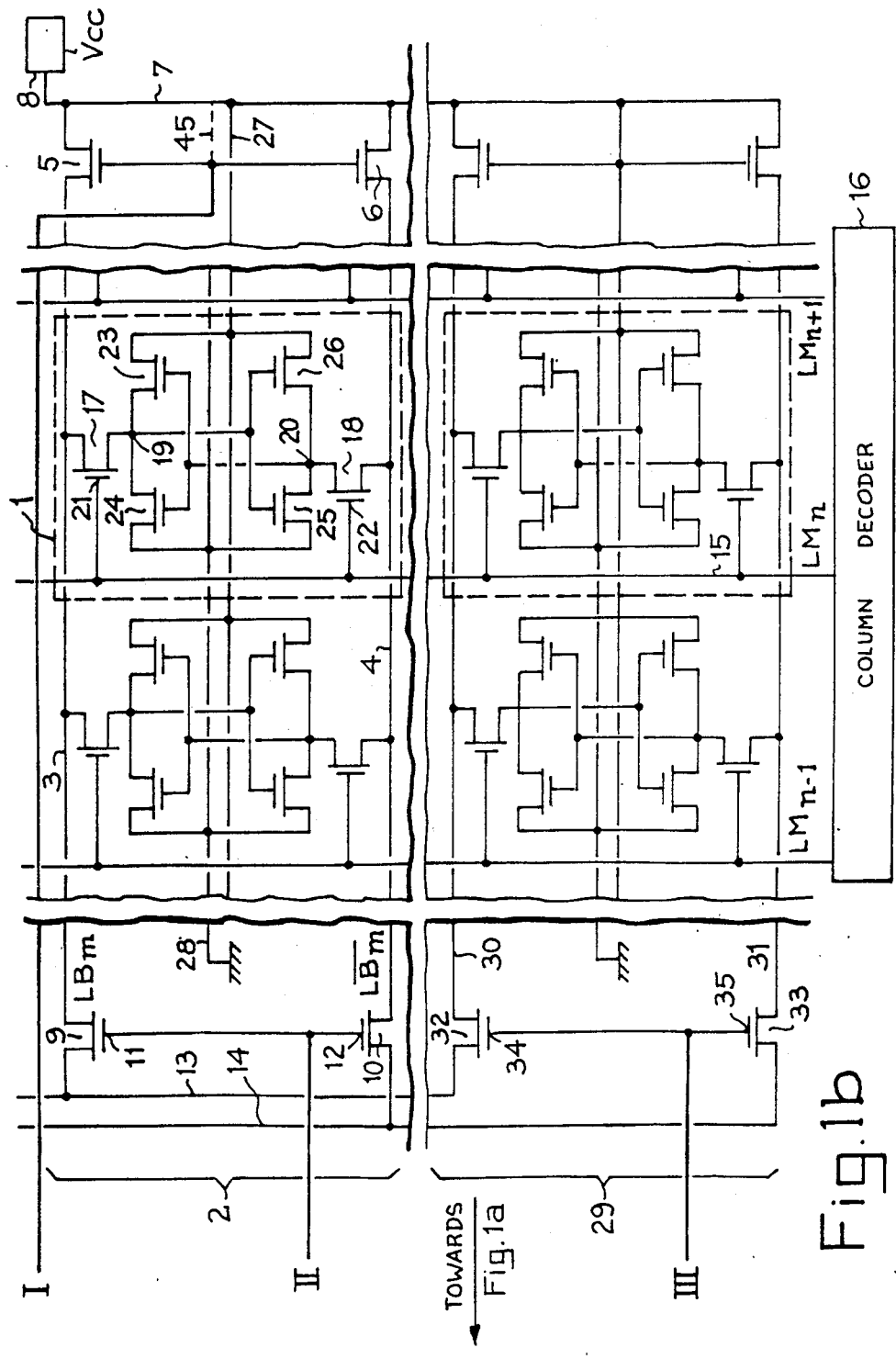

FIGS. 1a and 1b show a static random access memory comprising the improvements of the invention. This memory is in the form of an integrated circuit. What is shown in the Figure is the general organization diagram of this memory. Using conventional technology and known processes, it is known how to form such memories. The memory comprises (FIG. 1b) an arrangement of memory cells 1 divided into lines and columns. All the cells of a given line 2 are connected to the same two complementary connections 3 and 4 called bit lines. They are called complementary because when one is in a given electric state (corresponding to a given logic state) the other is in a complementary electric state (corresponding to an inverse logic state). These bit lines LBm and $\overline{LBm}$ are each biased to one end by a supply circuit respectively 5 and 6. Generally circuits 5 and 6 each comprise a transistor connected to a supply connection 7 which receives a potential $V_{cc}$ through an external pin 8. The purpose of these bias circuits is to maintain the bit lines 3 and 4 at potentials less than $V_{cc}$ so that these potentials may swing towards one state or towards another ($V_{CC}$ or O) depending on the state of the information contained in a cell such as 1 when this cell 1 is placed in relation with these bit lines.

At another end, the bit lines 3 and 4 are each in series with a selection circuit respectively 9 and 10. In one example, the selection circuits each comprise a transistor in series with the bit line. These transistors receive on their control electrodes, respectively 11 and 12, an order coming from a decoder. This order is transmitted by the connection II. When the decoder selects a cell line, electrodes 11 and 12 are brought to potentials such that transistors 9 and 10 are equivalent to short circuits. The electric states transported by the bit lines 3 and 4 are then applied to two complementary output connections respectively 13 and 14. The connections 13 and 14 may thus be placed in relation with any of the cell lines of the memory. But at a given time, only the selected cell line may transmit its information over these output connections.

In order to select a cell from all the other cells in the same line, this cell may further receive a communication enabling instruction delivered by an additional connection 15 called word line. All the word lines of the memory are in relation with a decoder called column decoder 16. The column decoder 16 further receives the column addresses of the information contained, or to be contained, in the memory and which it is desired to read out or write in. If the address of a memory cell is known it is possible to access it, by locating the memory word to which it belongs by word line such as line 15, and selecting by connections such as connection II the cell line to which it also belongs. The memory cell 1 consequently comprises two selection circuits, respectively 17 and 18 connected to the two bit lines on the one hand and to two complementary information collecting terminals, respectively 19 and 20, on the other. The control electrodes 21 and 22 of these circuits are connected to the word line 15. For storing the information, cell 1 essentially comprises a bistable circuit of a known type, with here four transistors numbered 23 to 26, supplied by two connections respectively 27 and 28 between $V_{cc}$ and ground.

In the invention, the memories also comprise additional cell lines such as 29 comparable to the normal cell lines. The cells of the redundant cell lines are connected, cell by cell, to the same word lines as those of the cell lines 2. The purpose of the repair circuits (FIG. 1a) is to switch the selection applied to connection II to a selection applied to a connection III. Which allows the cell line 29 to be also in relation with the output connections 13 and 14. For this, the bit lines 30 and 31 of line 29 are placed in relation with the connections 13 and 14 by means of series transistors 32 and 33 whose control electrode, 34 and 35, is connected to connection III. In other words, at any time, the orders given over the connection II of a cell line and over connection III of the memory are complementary: or else the cell line is in good condition and the redundant line 29 is not used or else it is the opposite. In normal time a repair circuit is assigned to a cell line 2. If, in the memory there is only a single redundant line 29, memories can only be repaired if they only contain a single defective cell line.

The repair circuit 36 of a cell line shown in FIG. 1a comprises three parts. A first part 37 comprises a bistable circuit. A second part 38 is formed essentially by a fuse which connects a terminal 39 of the bistable 37 to an imposed potential (here the supply potential $V_{cc}$). In a third part the repair circuit 36 comprises a switch 40 receiving on a control input 41 a voltage corresponding to the electric state of the bistable 37 and receiving on a switching input 42 an order coming from the decoder 43. This order which is the selection order is transmitted, depending on the state of bistable 37, over connection II towards cell line 2 which corresponds to the output concerned 44 of decoder 43, or to a repair connection III. The connection II is proper to each cell line. The connection III extends parallel to the memory plane and to the output connections 13 and 14 (or, which comes to the same thing, parallel to the word lines 15). The connection III therefore connects together all the repair circuits of a group of cell lines to which the same redundant cell line 29 has been attributed. So that the repair can be made, it is necessary for only a single one of the cell lines of this group to be defective.

The electric state of bistable 37 which is used for switching the selection, in switch 40, of the cell lines 2 or 29 is also used, by a connection I for controlling the supply circuits 5 and 6. They provide biasing of the bit lines 3 and 4 of the cell line 2 which it is desired to decouple from the memory. The cell line 2 is therefore decoupled functionally from the memory by application of the order, coming from switch 40, to the selection circuits 9 and 10 by the connection II. It will also be electrically decoupled from the memory by application of an adequate order to circuits 5 and 6. The circuits 5 and 6 will therefore be controlled instead of leaving them permanently connected by a connection 45 recalled here with a broken line. Having available the bistable 37, it is quite judicious to use the information which it represents, and which in itself gives information about the state of the bit line for controlling circuits 5 and 6. This is not an obligation. However, for space saving reasons during implantation of the circuits in the general lattice of the memory, this arrangement is quite advantageous: there is only the connection I to be made. It will be noted from FIG. 1b that the formation of connection I may raise a certain difficulty because it passes through a good part of the memory. In fact, being parallel to a bit line (for example the bit line 3) it may be formed, for its major part, at the same time as this latter. For the rest, it is sufficient to use the times during which different connections are formed in the memory for forming at the same time the complementary parts of this connection I.

One of the features of the invention is that the memory comprises intrinsic means 52 for melting the fuses. These means are not externally added means such as a laser. They are means contained in the logic circuits of the memory. The means for melting the fuses corresponding to each cell line comprise essentially a switch 46, connected in series with fuse 38, and controlled by a logic gate 47. This logic gate 47 has two inputs. A first input 48 is connected to an output 44 of the decoder which designates the cell line which it is desired to select. A second input 49 is connected to a connection 50 common to all the logic gates of the repair circuits of the memory. It is further connected to a single external access terminal 51.

The means 52 for melting the fuse 38 function as follows. Over bus 53 there is sent to decoder 43 the line address of a cell line which it is desired to neutralize because it has been detected that this line is defective. The fault may be functional and/or electric. The decoder 43 delivers at its output 44 relative to this line an electric state, in one example a zero state, corresponding to the selection of this line. The terminal 51 which is normally brought to an electric state 1, for example $V_{cc}$, is brought by external means to a zero state. These external means may be any electric contact means. The logic gate 47 which in the example is a NOR gate delivers at its output 54 a state 1 since it receives two zero states at the input. Switch 46 which essentially comprises a large transistor receives this state 1 on its base and places itself in a short circuit condition. The fuse is then connected in parallel between the supply $V_{cc}$ and ground. A heavy current may then flow through this fuse. This current is all the higher the bigger the transistor 46. This current causes the fuse to melt and this latter is decomposed.

Consequently, point A, the middle between fuse 38 and switch 46, which was before forced to a potential $V_{cc}$, is now open circuited. Under these conditions, circuit 37 is capable of changing state. The electric state at point A, available at the terminal 39 and circuit 37, changes and allows switch 40 to switch.

The operation of switch 40 is explained in the following way. The switch 40 comprises two transistors respectively 63 and 64 of complementary technology: in one example, transistor 63 is of a P type and transistor 64 is of N type. They receive the same potential from point A on their control electrode. They are further connected by one of their main electrodes to a connection 56. This connection 56 leads to the output 44 of decoder 43 which governs the cell line in question. Depending on the electric state of point A and when connection 56 receives an electric state corresponding to the selection of the cell line, a single one of these two transistors 63 or 64 is enabled so that this information may be transported to the connections II or III respectively. This alternative reflects the state in which the fuse is to be found: in good condition or decomposed.

The selection order of the cell line available at the output 44 of decoder 43 transists through the switch 40. In one example, this order is oriented by this switch towards the connection III corresponding to the redundant cell line whereas connection II passes to a disabling state for decoupling line II. Once the faults have been thus compensated for, the memory can be used like any memory. The address of the redundant cell line which has just taken the place of the defective cell line may be ficticiously compared with the address of the cell line which it replaces. It can thus be seen that use of the laser is no longer necessary. In fact, destruction of the fuses takes place by using the possibilities of the decoder 43 to which is applied the address of the defective cell line. It will be seen further on that it is possible to repair several defective cell lines by providing a division of the memory.

Then, once all the repairs have been undertaken, terminal 51 is again biased to an electric state 1: the selection of the cell lines is effected on request during use by the connections 56 which connect the outputs concerned of the decoder to the inputs concerned of the swtiches 40. The fact of having available only a single connection 50 for carrying out all the desired repairs of cell lines poses no problem at all. In fact, only a single logic gate 47, the one which receives the selection order from the decoder 43 and the order for decomposing the fuse, lets the useful order pass through to its output 54. The other logic gates of the other repair circuits of the other cell lines remain inactive.

The invention further comprises another feature with respect to the state of the art. This feature belongs to the bistable 37. In fact, when fuse 38 is destroyed by a laser ray, it is possible to design a simple circuit for point A to change electric state. This simplification is unfortunately not possible in the invention where the presence of switch 46 can be distinguished. Once fuse 38 has been destroyed point A must not remain in the open circuited position but must reliably change electric state. This is the role of circuit 37 of the invention. Any other circuit may of course be envisaged but the one which is described here has further advantages.

This circuit 37 comprises essentially five transistors: transistors 57 to 61. In one example in which the memory is made in accordance with complementary MOS technology (CMOS) only transistor 58 is of type P the others are of type N as well as the switching transistor 46. Transistors 58 and 60 are connected in cascade between the supply $V_{cc}$ and ground. Transistor 57 is connected in parallel between point A and ground. Point A is connected to the control electrode of transistors 58 and 59. The middle point of these two transistors is connected on the one hand to the control electrode of transistor 57 and on the other to the control electrode of transistor 61. The control electrode of transistor 60 is brought to the same potential as its drain. The drain and the source of transistor 61 are brought to potential $V_{cc}$.

When the fuse is not destroyed, point A is brought to potential $V_{cc}$. Transistor 58 which is of type P is therefore disabled. Consequently, point B which is the middle point between transistor 58 and transistor 59 is at zero. Therefore transistor 57 is disabled since it is of type N and since it receives a zero state on its control gate. The disabled transistor 57 holds point A at $V_{cc}$. Consequently, circuit 37 is stable in the state in which point A is brought to the potential $V_{cc}$.

On the other hand, when the fuse is destroyed a zero state appears at point A in the following way. At the time of switching on the memory (the day when it is decided to use it) transistor 61 which behaves with respect to the switching on as a capacity transmits to its gate 62 is state 1. Point B at state 1 short circuits the transistor 57. Consequently, point A drops to the zero state. With point A at the zero state transistor 58 is enabled. This finishes holding point B at 1 which is then effectively brought to the potential $V_{cc}$. Whereby circuit 37 is confirmed in another stable state the reverse of the preceding one.

The presence of transistor 60 is useful for shifting the triggering threshold of the bistable in the right direction. This triggering, which has no influence when fuse 38 is in good condition, is on the other hand orientated in the right direction, the one which tends to bring B to $V_{cc}$, when the fuse is decomposed. Similarly, transistor 46 which played the role of switch and which is a large transistor forms, in the disabled state, a large capacity at the time of switching on of the memory. Consequently point A, at the time of switching on, has rather a tendency to be brought to ground potential than to remain open circuited. This evolution is also favorable to the appearance of a potential A at zero when the fuse is decomposed.

Figure 2:
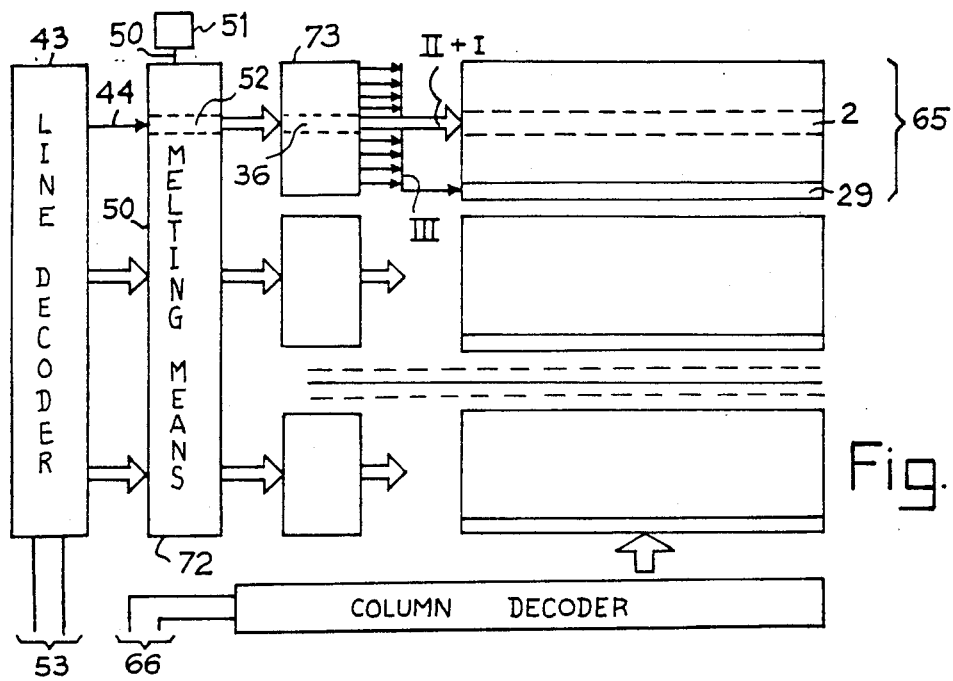
FIGS. 2 and 3, variants of the memory of the invention.

FIG. 2 shows a preferred architecture for forming the memories. In this, the cell lines such as 2 are grouped together in groups such as 65 comprising a given number of cell lines: for example 16. To each group of cell lines is assigned a redundant line 29. This line 29 may replace that one of lines 2 which has proved defective. In this embodiment will be noted the line decoder 43 which allows access to be had to all the cell lines of the memory. Downstream of decoder 43 is to be found the assembly 72 of circuits 52 for melting the fuses relative to the cell lines: the same connection 50, connected to the external pin 51, serves all the circuits 52. On the other hand, the whole of the repair circuits 36 is divided into groups 73 corresponding to the groups 65 of cell lines. For each group 73 there is only a single connection such as III which gives access to the redundant cell line 29. On the other hand, there are as many connections II and I as there are cell lines of the group. Finally under the stack of the groups can be seen decoder 16 which gives access to the columns of the memory. Decoder 43 and decoder 16 are connected to address buses respectively 53 and 66 for selecting the information contained in a single cell of the memory. In the description made up to now the memory cells are cells representative of an information bit. The invention is quite transposable to memories in which memory cells comprise several information bits.

Figure 3:
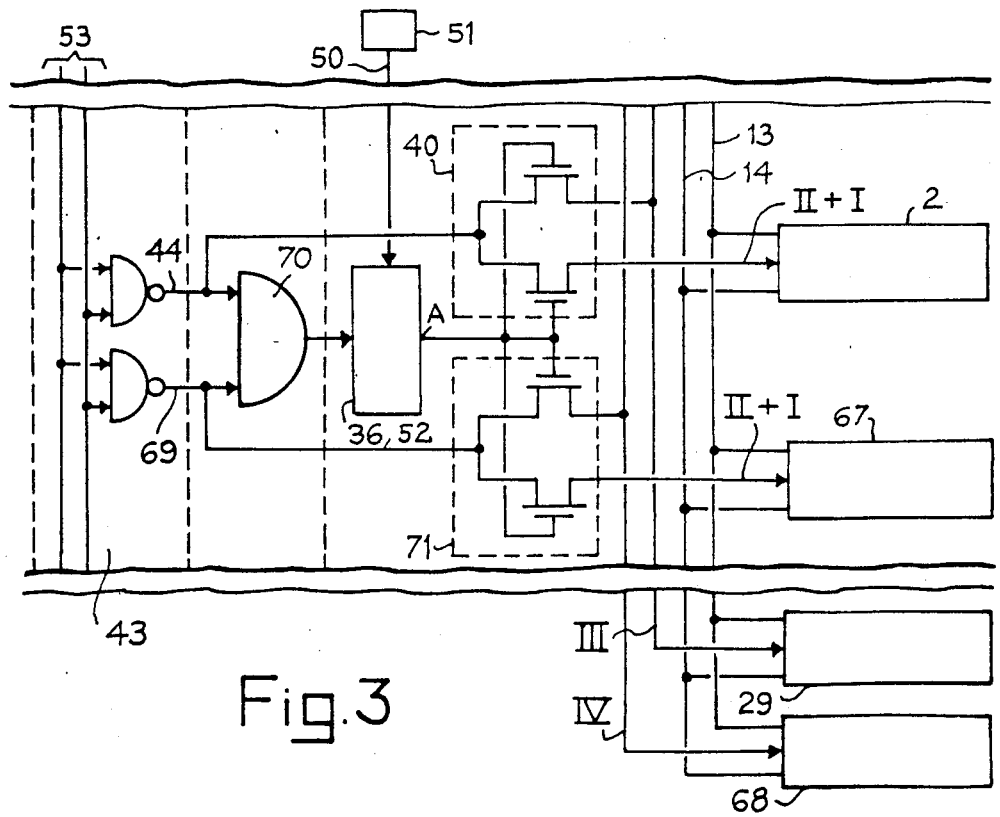

FIG. 3 shows a variant of the invention. In this variant, the construction of the bistable 37 and switch 46 has proved too space consuming to be readily integrated opposite a cell line 2. The space they require is such that they necessarily encroach on the space reserved for two cell lines. Since the organization described up to now takes place cell line by cell line, this consequence may be a latent loss of space. To overcome this disadvantage, two adjacent cell lines, lines 2 and 67, may be connected to the same repair assembly. The immediate result is that repair line 29 must also be split up: into lines 29 and 68. In this variant, there is only a single fuse for the repair circuit, but this latter is used whenever any one of the two cells lines concerned proves to be defective.

The outputs of the decoder, respectively 44 and 69, relative to these lines are then introduced into a logic gate 70 whose output is connected to the control electrode of means 36, 52 for melting the fuses. The information available at point A of the repair circuit is then transmitted to two parallel switches: switches 40 and 71. These switches switch the accesses to lines 2 and 67 into accesses respectively III and IV to the redundant cell lines 29 and 68. These latter two cell lines as well as all the cell lines, either of a group of cell lines or of the memory itself, are also connected to the output connections 13 and 14. Switch 71 is quite comparable to switch 40. In the example gate 70 is an AND gate since the selection of the cell lines concerned is made by a logic state zero for the outputs respectively 44 and 69 of the decoder 43.

What is claimed is:

1. An integrated circuit memory comprising:
    a plurality of memory cells distributed in lines and columns in a matrix;
    at least one decoder wherein the output of said at least one decoder is utilized for selecting cell lines;
    at least one repair circuit interconnected between, on one side, the cell lines and at least two repair connections and, on the other side, outputs of the said at least one decoder, each of said at least one repair circuit having a fuse and being capable of switching, depending on the state of the fuse, connections between the decoder and two lines into connections between the decoder and said two repair connections;

at least two additional cell lines each of said cell lines being connected to each of said at least two repair connections; and, wherein each of said at least one repair circuit comprises means for switching connections between two adjacent cell lines and said decoder into two connections between said decoder and said at least two repair connections.

2. The memory as claimed in claim 1, wherein said cell lines are grouped into a plurality of groups with each of said groups having at least two specific repair connections devoted to said each group and connected to at least two specific additional cell lines wherein said cell lines are also devoted to said each group.

3. The memory as claimed in any one of claims 1 or 2 further comprising:

means for melting said fuses, said means for melting comprising for each fuse, a switch in series with said fuse, a logic control gate having two inputs for actuating said switch;

a first input of the logic gate connected to an output of said decoder; and, a second input of the logic gate connected in common to a plurality of logic gates of each of said repair circuits of said memory and to a single external access terminal for controlling melting of said fuses.

4. The memory as claimed in claim 3 wherein said in series switches each comprises a transistor having a means for receiving on its control electrode a pulse controlled by the logic control gate.

5. The memory as claimed in claim 3 wherein each of said repair circuits comprise a bistable circuit wherein one output of said distable circuit is connected to a terminal of said fuse of said at least one repair circuit.

6. The memory as claimed in claim 5 further including a means whereby ones of said bistable circuits whose fuses have been melted are in a single predetermined electrical state wherein said electrical state is determined by switching on of said memory.

* * * * *